(12) United States Patent
Choi

(10) Patent No.: US 10,918,166 B2
(45) Date of Patent: Feb. 16, 2021

(54) INDUCTOR

(71) Applicant: SAMSUNG ELECTRO-MECHANICS CO., LTD., Suwon-si (KR)

(72) Inventor: Woon Chul Choi, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 0 days.

(21) Appl. No.: 16/751,415

(22) Filed: Jan. 24, 2020

(65) Prior Publication Data

US 2020/0154834 A1    May 21, 2020

Related U.S. Application Data

(63) Continuation of application No. 15/865,445, filed on Jan. 9, 2018, now Pat. No. 10,600,546.

(30) Foreign Application Priority Data

Jul. 25, 2017 (KR) .................. 10-2017-0094148

(51) Int. Cl.
| | | |
|---|---|---|
| *H01F 5/00* | (2006.01) | |
| *A44B 11/04* | (2006.01) | |
| *A43C 9/00* | (2006.01) | |
| *F16G 11/10* | (2006.01) | |
| *A43C 11/14* | (2006.01) | |

(52) U.S. Cl.
CPC ............... *A44B 11/04* (2013.01); *A43C 9/00* (2013.01); *A43C 11/14* (2013.01); *F16G 11/10* (2013.01)

(58) Field of Classification Search
USPC ........................................... 336/200
See application file for complete search history.

(56) References Cited

U.S. PATENT DOCUMENTS

| | | | |
|---|---|---|---|
| 9,945,042 B2 | 4/2018 | Cha et al. | |
| 10,217,563 B2 | 2/2019 | Wang et al. | |
| 10,559,417 B2 | 2/2020 | Ohkubo et al. | |
| 2014/0247101 A1* | 9/2014 | Cha .................. | H01F 41/12 336/198 |

(Continued)

FOREIGN PATENT DOCUMENTS

| | | |
|---|---|---|
| CN | 104347262 A | 2/2015 |
| CN | 104934187 A | 9/2015 |

(Continued)

OTHER PUBLICATIONS

Office Action issued in corresponding Chinese Patent Application No. 201810257555.2 dated Jul. 30, 2020, with English translation.

(Continued)

*Primary Examiner* — Ronald Hinson
(74) *Attorney, Agent, or Firm* — Morgan, Lewis & Bockius LLP

(57) ABSTRACT

An inductor includes a coil having a plurality of coil patterns and external electrodes connected thereto. An innermost coil pattern and an outermost coil pattern in the coil grow using first and second insulating wall as growth guides and the inductor has a structure in which there is no deviation in thickness and shape between the coil patterns.

17 Claims, 2 Drawing Sheets

(56) References Cited

U.S. PATENT DOCUMENTS

| | | | |
|---|---|---|---|
| 2014/0292469 A1* | 10/2014 | Cha | H01F 17/0013 |
| | | | 336/200 |
| 2015/0035640 A1* | 2/2015 | Wang | H01F 27/2804 |
| | | | 336/200 |
| 2015/0270053 A1* | 9/2015 | Cha | C25D 5/02 |
| | | | 336/192 |
| 2016/0351316 A1* | 12/2016 | Ohkubo | H01F 27/325 |
| 2019/0051446 A1* | 2/2019 | Park | H01F 17/04 |

FOREIGN PATENT DOCUMENTS

| | | |
|---|---|---|
| CN | 106205956 A | 12/2016 |
| JP | H09-252087 A | 9/1997 |
| KR | 10-1999-0066108 A | 8/1999 |
| KR | 10-2014-0108873 A | 9/2014 |

OTHER PUBLICATIONS

Notice of Allowance issued in corresponding U.S. Appl. No. 15/865,445 dated Nov. 14, 2019.

Office Action issued in corresponding U.S. Appl. No. 15/865,445 dated May 30, 2019.

\* cited by examiner

INDUCTOR

CROSS-REFERENCE TO RELATED APPLICATION(S)

This application is the continuation application of U.S. patent application Ser. No. 15/865,445 filed on Jan. 9, 2018, which claims benefit of priority to Korean Patent Application No. 10-2017-0094148 filed on Jul. 25, 2017 in the Korean Intellectual Property Office, the disclosure of which is incorporated herein by reference in its entirety.

TECHNICAL FIELD

The present disclosure relates to an inductor, and more particularly, to a thin film type power inductor.

BACKGROUND

In accordance with the development of information technology (IT), apparatuses have been rapidly miniaturized and thinned. Therefore, market demand for small, thin devices has increased.

Korean Patent Laid-Open Publication No. 10-1999-0066108 provides a power inductor including a substrate having a via hole and coils disposed on opposite surfaces of the substrate and electrically connected to each other through the via hole of the substrate in accordance with a technical trend to make an effort to provide an inductor including coils having uniform and high aspect ratios. However, there is still a limitation in forming coils having uniform high aspect ratios due to limitations in a manufacturing process.

SUMMARY

An aspect of the present disclosure may provide an inductor including coil patterns having a high aspect ratio while improving direct current resistance (Rdc) distribution by decreasing a difference in thickness between a plurality of coil patterns in a coil.

According to an aspect of the present disclosure, an inductor may include: a body; and first and second external electrodes disposed on an external surface of the body. The body may include a support member; a coil supported by the support member; first and second insulating walls; and an insulating film simultaneously enclosing the coil and the first and second insulating walls. Each of the first and second insulating walls may be formed of a single integrated insulating wall without an internal boundary surface.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Hereinafter, an inductor according to an exemplary embodiment in the present disclosure will be described. However, the present disclosure is not necessarily limited thereto.

Inductor

Figure 1:
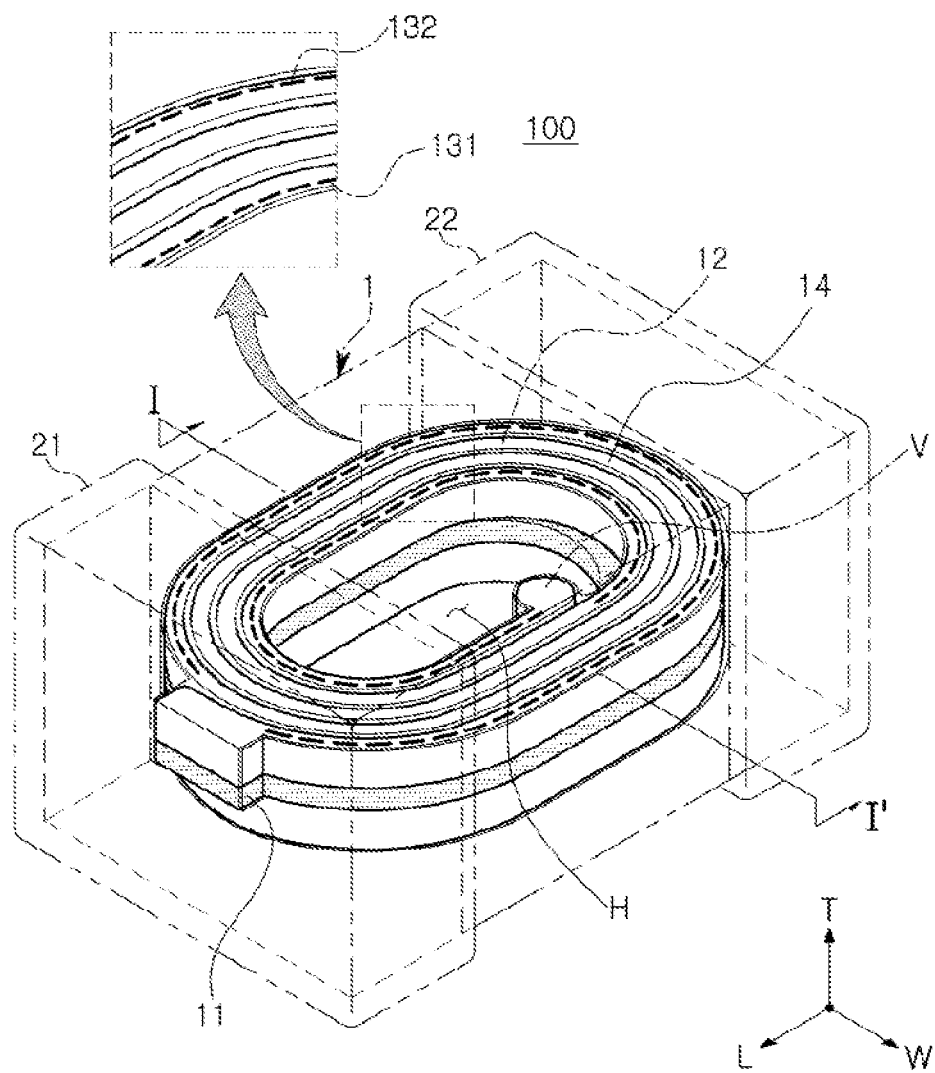
FIG. 1 is a schematic perspective view illustrating an inductor according to an exemplary embodiment in the present disclosure.
Figure 2:
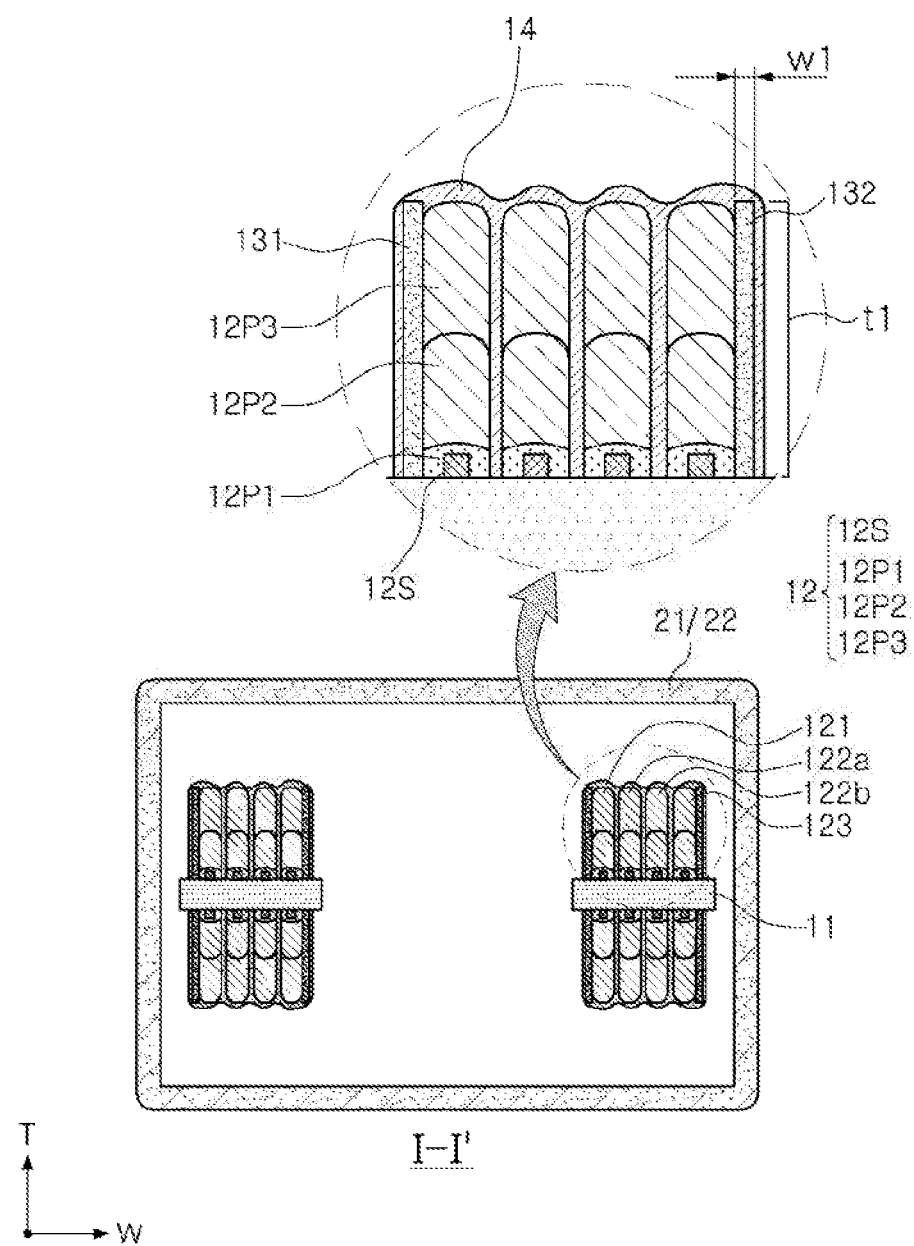
FIG. 2 is a schematic cross-sectional view taken along line I-I' of FIG. 1.

FIG. 1 is a schematic perspective view illustrating an inductor according to an exemplary embodiment in the present disclosure, and FIG. 2 is a cross-sectional view taken along line I-I' of FIG. 1.

Referring to FIGS. 1 and 2, an inductor 100 according to the exemplary embodiment may include a body 1 configuring an entire exterior of the inductor and first and second external electrodes 21 and 22 disposed on an external surface of the body 1.

The body 1 may have upper and lower surfaces opposing each other in a thickness (T) direction, first and second end surfaces opposing each other in a length (L) direction, and first and second side surfaces opposing each other in a width (W) direction, and be substantially hexahedron. However, an external shape of the body is not limited.

The body 1 may contain a magnetic material. For example, the body 1 may be formed by filling a ferrite material or a metal based soft magnetic material. An example of the ferrite may include ferrite known in the art such as Mn—Zn based ferrite, Ni—Zn based ferrite, Ni—Zn—Cu based ferrite, Mn—Mg based ferrite, Ba based ferrite, Li based ferrite, or the like. The metal based soft magnetic material may be an alloy containing at least one selected from the group consisting of Fe, Si, Cr, Al, and Ni. For example, the metal based soft magnetic material may contain Fe—Si—B—Cr based amorphous metal particles, but is not limited thereto. The metal based soft magnetic material may have a particle diameter of 0.1 µm or more to 20 µm or less and be contained in a form in which the metal based soft magnetic material is dispersed in a polymer such as an epoxy resin, polyimide, or the like.

A support member 11 may be disposed in the body 1 and serve to suitably support a coil while allowing the coil to be easily formed. As the support member, a support member having insulating properties and a thin film shape may be suitably used. For example, a general copper clad laminate (CCL) substrate, or the like, may be used. Specifically, the support member 11 may have a thickness sufficient to support the coil. For example, preferably, the support member 11 may have a thickness of about 60 µm or so. Further, a through hole H may be included in a central portion of the support member 11, and since a magnetic material is filled in the through hole H, a magnetic flux of the coil may be improved.

Next, a coil 12 including a plurality of coil patterns 121, 122a, 122b, and 123 on an upper surface of the support member, supported by the support member, and first and second insulating walls 131 and 132 adjacent to an outermost coil pattern 123 and an innermost coil pattern 121 among the coil patterns will be described. The coil 12 may include an upper coil disposed on the upper surface of the support member 11 and a lower coil disposed on a lower surface of the support member 11, and the upper and lower coils may be electrically connected to each other through a via V in the support member. However, for convenience of explanation, the coil 12 will be described based on the upper coil. Of course, a description of the coil to be provided below may be applied to the lower coil as it is.

Preferably, the coil 12 may have an overall spiral shape and have, on average, an aspect ratio of 1.0 or more. An aspect ratio is define to be a ratio of a thickness (or a height) to a width. The coil 12 may include the plurality of coil patterns. Among them, each of the innermost coil pattern 121 most adjacent to the through hole and the outermost coil pattern 123 most adjacent to the external surface of the body may come into at least partial contact with the first and second insulating walls 131 and 132 adjacent thereto. In detail, at least a portion of a side surface of the innermost coil pattern 121 may come into contact with the first insulating wall 131. Although a case in which the side surface of the innermost coil pattern 121 entirely comes into contact with the first insulating wall 131 is illustrated in FIG. 2, the innermost coil pattern 121 is not limited thereto. That is, only at least a portion of the side surface may partially come into contact with the first insulating wall 131. Particularly, when a width of a lower portion of the innermost coil pattern is wider than that of an upper portion thereof, the upper portion of the innermost coil pattern may come into contact with the first insulating wall, but the lower portion thereof may be spaced apart from the first insulating wall by a predetermined interval. Similarly, at least a portion of a side surface of the outermost coil pattern 123 may come into contact with the second insulating wall 132. Although a case in which the side surface of the outermost coil pattern 123 entirely comes into contact with the second insulating wall 132 is illustrated in FIG. 2, the outermost coil pattern 123 is not limited thereto. That is, only at least a portion of the side surface of the outermost coil pattern 123 may partially come into contact with the second insulating wall 132. Particularly, when a width of a lower portion of the outermost coil pattern is wider than that of an upper portion thereof, the upper portion of the outermost coil pattern may come into contact with the second insulating wall, but the lower portion thereof may be spaced apart from the second insulating wall by a predetermined interval.

Thicknesses t1 of the first and second insulating walls 131 and 132 may be approximately 200 μm or more, but are not limited thereto and may be suitably selected by those skilled in the art. Since the first and second insulating walls are formed of single integrated insulating walls even though the first and second insulating walls are significantly thick insulating walls (having a thickness of approximately 200 μm or more), problems caused in a case of forming a plurality of insulating walls may be entirely solved. The first and second insulating walls 131 and 132 may have an aspect ratio of 3.0 or more. For example, a width w1 of the first and second insulating walls 131 and 132 in the width direction may be approximately 20 to 50 μm. In addition, preferably, the thickness of the first insulating wall may be greater than a height of an uppermost surface of the innermost coil pattern adjacent thereto, and the thickness of the second insulating wall may be equal to or greater than a height of an uppermost surface of the outermost coil pattern adjacent thereto. The reason is that this case is advantageous for allowing the coil pattern to stably grow using the first and second insulating walls as guides and allowing a structure of the coil pattern to uniformly grow. The first and second insulating walls 131 and 132 may not contain concave and convex portions in a growth direction of the coil pattern.

Meanwhile, each of the coil patterns 121, 122a, 122b, and 123 may include a seed layer 12s coming in contact with the support member 11 and a plurality of plating layers 12p1, 12p2, . . . formed on the seed layer 12s. Boundaries between the seed layer and each of the plating layers in the plurality of plating layers may be confirmed by a microscope such as a scanning electron microscope (SEM), or the like. A method of manufacturing the seed layer 12s is not limited and an electroless plating method, a sputtering method, a chemical etching method, or the like, may be suitably selected by those skilled in the art in consideration of process conditions, product specifications, and the like. Preferably, a width of the seed layer 12s in the width direction (a maximum width of the seed layer 12s in a case in which a width of the seed layer 12s is changed in the thickness direction) may be equal to or smaller than a maximum width of the plurality of plating layers disposed thereon. However, since the first and second insulating walls 131 and 132 are disposed at the outside the coil (the inside of the innermost coil pattern and the outside of the outermost coil pattern), in a case of performing anisotropic plating on the seed layer, a flow rate ($Cu^{2+}$) supplied to each of the seed layers are equal, thereby preventing an over-plating layer from being formed as a plating layer of a specific coil pattern. Therefore, a difference between the width of the seed layer and the maximum width of the plating layer on the seed layer is not large.

Further, the plurality of plating layers 12p1, 12p2, . . . may be formed by a suitable combination of anisotropic plating and isotropic plating. FIG. 2 illustrates a case in which a first plating layer 12p1 is formed on the seed layer 12s by performing the isotropic plating and then second and third plating layers 12p2 and 12p3 are formed by continuously performing the anisotropic plating two times.

Referring to FIG. 2, alignments between the first plating layers, the second plating layers, and the third plating layers may substantially coincide with each other. Here, the alignments substantially coincide with each other may mean that virtual lines along the thickness direction connecting the centers of lower portions of respective plating layers to the centers of upper portions of the respective plating layers substantially coincide with each other. The reason is that the first and second insulating layers have an aspect ratio of 3.0 or more and a height of about 200 μm or more, and each of the first and second insulating walls is formed of a single integrated insulating wall without an internal boundary surface. At least one internal boundary surface is present in the first and second insulating walls, which means that a plurality of processes are required to form the first and second insulating walls. To this end, there is a need to control alignments between respective plating layers again. Therefore, it may be significantly difficult to control alignments between two or more plating layers among the first to third plating layers. Since in the inductor according to the present disclosure, the insulating wall is formed of the single insulating wall, at the time of forming the respective plating layers, a process of forming an insulating wall is not included. Therefore, there is no difficulty in controlling alignments between the respective plating layers. Further, there is no possibility that abnormalities will occur in shapes of the first and second insulating walls, and since the first and second insulating walls remain in a chip of a final inductor as they are, an unpeeling defect occurring at the time of removing the insulating wall in the vicinity of a lead portion of the coil adjacent to the second insulating wall may be prevented in advance.

In addition, referring to FIG. 2, widths of the first plating layer, the second plating layer, and the third plating layer in the width direction may be substantially equal to each other, which means that over-plating is not formed in a specific coil pattern. Generally, an anisotropic plating method is a method adopted at the time of forming a seed pattern and then implementing the rest thickness of the coil in order to implement a required aspect ratio. In this case, uniformity of thicknesses and shapes of coil patterns tends to be frequently deteriorated, thereby having a negative influence on Rdc distribution. Further, when a shape of the coil pattern is grown abnormally, the coil pattern may be bent, and thus, as a spaced distance between the coil patterns is gradually decreased, a risk that a short circuit will occur may be increased. As a result, in a case of restricting growth of the coil pattern in order to prevent the short circuit, it may be impossible to obtain a coil having a high aspect ratio. However, since the first and second insulating walls of the inductor according to the exemplary embodiment in the present disclosure have smooth side surfaces and are formed of single integrated insulating walls and thus widths of the upper and lower portions thereof are substantially equal to each other, even in a case of alternately performing the isotropic plating and/or anisotropic plating several times, the flow rate supplied to the seed layer may be uniformly controlled, such that width and thickness distribution caused by plating growth may be significantly controlled. As a result, the widths of the first plating layer (isotropic plating), the second plating layer (anisotropic plating), and the third plating layer (anisotropic plating) may be substantially equal to each other.

Next, an insulating film 14 filling spaces between the plurality of coil patterns and covering upper surfaces of the plurality of coil patterns will be described. Since the insulating film 14 encloses upper surfaces and side surfaces of the first and second insulating walls 131 and 132, the inductor may have a double insulating structure. Insulation between the coil patterns and between the coil pattern and the magnetic material may be more clearly secured through the double insulating structure as described above. The first and second insulating walls 131 and 132 may contain a permanent type photosensitive insulating material, for example, a photosensitive material containing a bisphenol based epoxy resin as a main ingredient. Here, the bisphenol based epoxy resin may be, for example, a bisphenol A novolac epoxy resin, a bisphenol A diglycidyl ether bisphenol A polymer resin, or the like, but is not limited thereto. Any material may be used as long as it is a general permanent type resist material.

Meanwhile, the insulating film may be implemented by a method known in the art. For example, the insulating film may be formed by a spray method or a chemical vapor deposition method. Preferably, the insulating film may have a structure corresponding to shapes of the upper convex surfaces of the coil pattern disposed below the insulating film. In this case, a thickness of the insulating film may be significantly decreased, such that an unnecessary space required to form the insulating film may be significantly decreased, and a space filled with the magnetic material may be sufficiently secured. A material of the insulating film is not particularly limited and may be suitably selected depending on a used method and use conditions. For example, the insulating film may contain a perylene resin.

The insulating film 14 may serve to fill the spaces between the plurality of coil patterns to prevent a short circuit between the coil patterns. Since uniformity of the shapes and widths of the upper and lower portions of each of the coil patterns is substantially maintained, there is no risk of a defect that the insulating film will not be formed up to the lower portions of the coil pattern. The insulating film 14, the, the first and second insulating walls 131 and 132, and the magnetic material forming the body 1 may made of different materials.

Referring back to FIG. 1, the first and second external electrodes 21 and 22 disposed on the external surface of the body 1 and connected to the coil may have an alphabet C shape, but are not limited thereto. If necessary, the shapes of the first and second external electrodes 21 and 22 may be suitably by those skilled in the art. Since the first and second external electrodes 21 and 22 are electrically connected to the coil, the first and second external electrodes 21 and 22 need to be formed of a material having excellent electrical conductivity. The first and second external electrodes may also contain a conductive resin, and may also include pre-plating layers in order to increase a contact area with the coil to decrease Rdc.

With the inductor described above, the aspect ratio of the coil may be significantly increased, and uniformity of the widths and cross-sectional shapes of the coil pattern, and the like, may be improved. As a result, Rdc distribution may be improved, a high aspect ratio and insulation reliability may be simultaneously secured, and an unnecessary process such as a process of removing the insulating wall, or the like, may be omitted, such that economical efficiency in the process may be secured.

As set forth above, according to exemplary embodiments in the present disclosure, the inductor including the coil having a higher aspect ratio to decrease Rdc while improving thickness distribution of the coil patterns to improve Rdc distribution may be provided.

While exemplary embodiments have been shown and described above, it will be apparent to those skilled in the art that modifications and variations could be made without departing from the scope of the present invention as defined by the appended claims.

What is claimed is:

1. An inductor comprising:
    a body including:
        a support member including a through hole,
        a coil including a plurality of coil patterns disposed on the support member and connected to each other to have an overall spiral shape, each of the plurality of coil patterns including a first plating layer and a second plating layer stacked on the first plating layer,
        a first insulating wall being at least partial contact with an innermost coil pattern among the plurality of coil patterns,
        a second insulating wall being at least partial contact with an outermost coil pattern among the plurality of coil patterns, and
        an insulating film filling spaces between the plurality of coil patterns, covering upper surfaces of the first and second insulating walls and enclosing at least a portion of surfaces of the first and second insulating walls that do not contact with the innermost coil pattern or the outermost coil pattern among surfaces of the first and second insulating walls; and
    first and second external electrodes disposed on an external surface of the body and connected to the coil.

2. The inductor of claim 1, wherein an entire side surface of the innermost coil pattern is contact with the first insulating wall, and an entire side surface of the outermost coil pattern is contact with the second insulating wall.

3. The inductor of claim 1, wherein the first insulating wall extends to a position equal to or higher than a position of an uppermost surface of the innermost coil pattern, and the second insulating wall extends to a position equal to or higher than a position of an uppermost surface of the outermost coil pattern.

4. The inductor of claim 1, wherein each of the first and second insulating walls is a single insulating layer.

5. The inductor of claim 1, wherein each of the first and second insulating walls has an aspect ratio of 3.0 or more.

6. The inductor of claim 1, wherein each of the plurality of coil patterns is composed of a seed layer and a plurality of plating layers formed on the seed layer.

7. The inductor of claim 6, wherein the seed layer is disposed on an upper surface of the support member, and except for a surface of the seed layer being in contact with the support member, the other surfaces of the seed layer are enclosed by the plurality of plating layers.

8. The inductor of claim 1, wherein a virtual line connecting the center of a lower surface of the first plating layer to the center of an upper surface thereof coincides with a virtual line connecting the center of a lower surface of the second plating layer to the center of an upper surface thereof.

9. The inductor of claim 6, wherein among the plurality of plating layers, a plating layer disposed directly on the seed layer is an isotropic plating layer, and the other plating layers are anisotropic plating layers.

10. The inductor of claim 1, wherein a portion of the insulating film disposed on upper surfaces of the plurality of coil patterns has a shape corresponding to the upper surfaces of the plurality of coil patterns.

11. The inductor of claim 1, wherein the first and second insulating walls contain a permanent type epoxy-based insulating material.

12. The inductor of claim 1, wherein the first and second insulating walls do not contain concave and convex portions in a growth direction of the coil pattern.

13. The inductor of claim 1, wherein the first and second insulating walls and the insulating film are made of materials different from each other.

14. The inductor of claim 1, wherein each of the plurality of coil patterns has a convex upper surface.

15. The inductor of claim 1, wherein a magnetic material is provided on the support member and a surface of the insulating film.

16. The inductor of claim 1, wherein the coil includes an upper coil formed on an upper surface of the support member and a lower coil formed on a lower surface of the support member, and the upper and lower coils are electrically connected to each other through a via in the support member.

17. The inductor of claim 6, wherein a thickness of the first insulating wall is greater than a sum of thicknesses of the seed layer and the first and second plating layers of the innermost coil pattern, and a thickness of the second insulating wall is greater than a sum of thicknesses of the seed layer and the first and second plating layers of the outermost coil pattern.

* * * * *